(12) United States Patent  
Kado et al.

(10) Patent No.: US 7,134,817 B2  
(45) Date of Patent: Nov. 14, 2006

(54) PRINTED BOARD MACHINING APPARATUS

(75) Inventors: Hirofumi Kado, Ebina (JP); Yasushi Ito, Ebina (JP); Nobuhiko Suzuki, Ebina (JP)

(73) Assignee: Hitachi Via Mechanics, Ltd., Kanagawa-Ken (JP)

( * ) Notice: Subject to any disclaimer, the term of this patent is extended or adjusted under 35 U.S.C. 154(b) by 97 days.

(21) Appl. No.: 10/855,439

(22) Filed: May 28, 2004

(65) Prior Publication Data

US 2005/0019122 A1    Jan. 27, 2005

(30) Foreign Application Priority Data

Jun. 2, 2003    (JP) ............... 2003-157161

(51) Int. Cl.
  *B23B 47/00*    (2006.01)
  *B23Q 11/00*    (2006.01)
(52) U.S. Cl. .............. 409/137; 409/136; 408/16; 408/56; 408/67
(58) Field of Classification Search .............. 409/137, 409/136; 408/98, 16, 56, 67
  See application file for complete search history.

(56) References Cited

U.S. PATENT DOCUMENTS

| | | | |
|---|---|---|---|
| 4,340,326 A * | 7/1982 | Buonauro et al. | 408/16 |
| 4,382,728 A * | 5/1983 | Anderson et al. | 409/137 |
| 4,813,825 A * | 3/1989 | Kosmowski | 408/98 |
| 4,915,550 A * | 4/1990 | Arai et al. | 408/56 |
| 4,984,352 A * | 1/1991 | Reed et al. | 409/137 |
| 5,024,562 A | 6/1991 | Arai et al. | |
| 5,090,847 A * | 2/1992 | Gelston, II | 408/16 |
| 5,332,343 A * | 7/1994 | Watanabe et al. | 409/136 |
| 5,487,629 A * | 1/1996 | Watanabe | 409/137 |
| 5,544,986 A * | 8/1996 | Kudo et al. | 408/67 |
| 5,617,898 A * | 4/1997 | Nagai et al. | 137/884 |
| 5,779,402 A * | 7/1998 | Kameda | 408/56 |

FOREIGN PATENT DOCUMENTS

EP    1405692 A2    4/2004

* cited by examiner

*Primary Examiner*—Monica Carter
*Assistant Examiner*—Dana Ross
(74) *Attorney, Agent, or Firm*—Wenderoth, Lind & Ponack, L.L.P.

(57) ABSTRACT

There is provided a printed board machining apparatus that is capable of improving machining efficiency without hampering machining accuracy. The printed board machining apparatus includes a pressure foot which is provided with a port whose one end is opened at a lower surface of the pressure foot facing a stiffening plate, and whose other end is connected to a compressed gas source to blow out gas from the port at a pressure which does not interfere with the pressure foot pressurizing the stiffening plate and printed boards in machining the printed boards. It is noted that the gas is blown out during a period of time at least when the pressure foot and the stiffening plate are moving relatively in the horizontal direction.

13 Claims, 5 Drawing Sheets

PRINTED BOARD MACHINING APPARATUS

BACKGROUND OF THE INVENTION

1. Field of the Invention

The present invention relates to a printed board machining apparatus for machining workpieces by a tool while pressing down the peripheral part of the workpiece to a table by a pressure foot.

2. Related Background Art

FIG. 4 is a schematic perspective view showing an outside view of a prior art printed board hole driller, i.e., an exemplary printed board machining apparatus, and FIG. 5 is a front section view of an edge of a spindle and a pressure foot of the printed board hole driller shown in FIG. 4.

As shown in FIGS. 4 and 5, the printed board hole driller 14 is constructed so that a table 1 therein moves in the direction of an arrow X by an X-axis motor 2 on a track 4 fixed on a bed 3. A column 5 is fixed to the bed 3 so as to straddle the table 1. A cross slide 6 is arranged to move in the direction of an arrow Y on a track 9 fixed on the column 5 by a Y-axis motor 7 and a ball screw 8. A housing 10 is arranged so as to move up and down on a track 13 fixed to the cross slide 6 in the direction of an arrow Z by a Z-axis motor 11 and a ball screw 12.

The housing 10 supports a spindle 21 that rotably supports a drill 20, i.e., a tool. The housing 10 also supports a pressure foot body portion 22 that engages with the edge portion of the spindle 21 through a cylinder not shown so as to move up and down in the Z-axis direction. The pressure foot body portion 22 is provided with a bush 23 at the end thereof. A drill through opening 29 through which the drill 20 moves in and out is made at the axial center position of the bush 23. A part in which the pressure foot body portion 22 is combined with the bush 23 will be referred to as a pressure foot 32 hereinafter.

A groove 24 connecting an outer peripheral part of the bush 23 with the drill through opening 29 is made at the lower end of the bush 23. A space 25 made by the spindle 21 and the pressure foot 32 is connected to a dust collector 27 via a pipe 26. ACNC unit 28 controls the motors of the respective axes.

A plurality of printed boards 30, i.e., workpieces, are stacked and are fixed on the table 1 together with a stiffening plate 31 placed at the top thereof. The stiffening plate 31 is made from an aluminum plate having a thickness of about 0.5 mm.

In drilling the stiffening plate 31 and the printed boards 30, the printed board hole driller 14 lowers the pressure foot 32 by an air cylinder not shown, turns on the dust collector 27 to vacuum the space 25 and lowers the spindle 21 to a predetermined height after positioning the drill 20 at a drilling position. Then, the printed board hole driller 14 presses down the stiffening plate 31 and the printed boards 30 to the table 1 by the pressure foot 32 to drill the stiffening plate 31 and the printed boards 30 by the drill 20.

When the drilling ends, the printed board hole driller 14 raises the pressure foot 32 and the spindle 21 to a position where the lower end of the pressure foot 32 (lower end of the bush 23) does not interfere the stiffening plate 31 and moves the pressure foot 32 and the spindle 21 in the horizontal direction together with the drill 20 to position the drill 20 at a next machining position.

Because the prior art printed board hole driller 14 is constructed so as to cut into the stiffening plate 31 by the drill 20 while pressing down the stiffening plate 31 and the printed boards 30 to the table 1 by the pressure foot 32 as described above, it permits an accuracy of machining position to be improved. Further, because the prior art printed board hole driller 14 is constructed so as to be able to collect work chips produced in drilling the workpieces immediately within the dust collector 27 by air flowing into the space 25 through the groove 24 as shown in FIG. 5, it permits holes to be made accurately.

By the way, it is desirable to keep the position of the edge of the drill 20 as close as possible to the stiffening plate 31 (hereinafter referred to as a 'standby position') in moving the drill 20 to the next machining position in order to improve the drilling efficiency of the printed board hole driller 14. However, because the position of the edge of the drill 20 in connection with the lower end of the pressure foot 32 is set in advance, the lower end of the pressure foot 32 is brought closer to the stiffening plate 31, and a distance L1 between the stiffening plate 31 and the pressure foot 32 is shortened when the position of the edge of the drill 20 at the standby position is brought closer to the stiffening plate 31.

However, when the distance L1 is shortened too much, there is a case when the stiffening plate 31 is lifted up because it is suctioned to the side of the pressure foot 32 by the dust collecting force of the dust collector 27 as shown in FIG. 5. Then, the stiffening plate 31 might be damaged if it collides with the lower end of the pressure foot 32. When the damaged part is the part to be drilled next, drilling may not be done accurately at the predetermined position or the drill may be broken as the edge of the drill 20 may slide when it abuts the stiffening plate 31.

As a printed board hole driller dealing with such a problem, Japanese Patent Laid-open No. Hei.3-3713 has proposed one that pressurizes a stiffening plate and printed boards by compressed air while lifting up a pressure foot from the stiffening plate by forming an air film between the lower face of the pressure foot and the stiffening plate by blowing compressed air from a port made at the lower face of the pressure foot in drilling the printed boards. It allows to shorten the distance L1 and to prevent the interference between the pressure foot and the stiffening plate, thus preventing the stiffening plate from being damaged.

However, the prior art printed board hole driller has required a large amount of compressed air to support the pressure foot. Further, the pressurizing force fluctuates considerably, and the pressurization of the stiffening plate and the printed boards has been unstable as compared to the case of abutting the pressure foot directly to the stiffening plate.

SUMMARY OF THE INVENTION

It is an object of the invention to provide a printed board machining apparatus whose machining efficiency is improved without dropping its machining accuracy.

According to one aspect of the invention, the inventive printed board machining apparatus comprises a spindle rotatably having a tool for machining workpieces placed on a table, and a pressure foot fitted to the spindle movably along the axial direction of the spindle and having a contact face that contacts the workpiece and a tool through opening which is made through the contact face and through which an edge of the tool moves in and out. The printed board machining apparatus is designed to machine the workpieces by the tool while vacuuming a space made between the spindle and the pressure foot and while pressing down the workpieces to the table by the contact face of the pressure foot. The printed board machining apparatus further comprises, at the contact face of the pressure foot, a compressed gas blowout port for blowing out compressed gas supplied from compressed gas supplying means that supplies compressed gas to prevent the workpieces from being lifted up, and a groove for communicating the outer peripheral part of the pressure foot with the tool through opening when the contact face is in contact with the workpiece.

The pressure of the compressed gas blown out of the compressed gas blowout port is set at a pressure which will not interfere with the contact face of the pressure foot contacting the workpiece so as to permit the contact face to contact the workpieces in machining the workpieces.

Preferably, the printed board machining apparatus stops the compressed gas supplying means from supplying compressed gas when the contact face of the pressure foot is in contact with the workpiece.

Preferably, the compressed gas supplying means blows out the compressed gas from the compressed gas blowout port when at least either one of the tool and the workpiece is moving in the direction crossing the axial direction of the spindle.

Preferably, the compressed gas blowout port is opened in the direction of the tool.

Preferably, the printed board machining apparatus is provided with a pressure sensor for measuring a negative force within the space so that the compressed gas supplying means can increase or decrease the pressure of the compressed gas in accordance with the decrease or increase of the pressure measured by the pressure sensor.

As described above, according to the invention, the pressure of the compressed gas blown out of the compressed gas blowout port is set at the pressure which will not interfere with the contact face of the pressure foot contacting the workpiece, so that it is possible to prevent the stiffening plate from being lifted up with a small amount of gas and to improve machining speed and accuracy.

The specific nature of the invention, as well as other objects, uses and advantages thereof, will clearly appear from the following description and from the accompanying drawings.

BRIEF DESCRIPTION OF THE DRAWINGS

FIGS. 3a, 3b, 3c and 3d are schematic section views for explaining an operation of the printed board machining apparatus of the embodiment, wherein FIG. 3a shows a state in which a drill that has moved in the horizontal direction is positioned at a standby machining position and is about to move down together with a spindle, FIG. 3b shows a state in which a pressure foot is in contact with a stiffening plate, FIG. 3c shows a state in which the pressure foot is about to be separated from the stiffening plate and FIG. 3d shows a state in which the drill has risen to the standby position to start to move in the horizontal direction.

DESCRIPTION OF THE PREFERRED EMBODIMENTS

A printed board hole driller, i.e., an exemplary printed board machining apparatus, of a preferred embodiment of the invention will be explained below with reference to the drawings.

Figure 1:
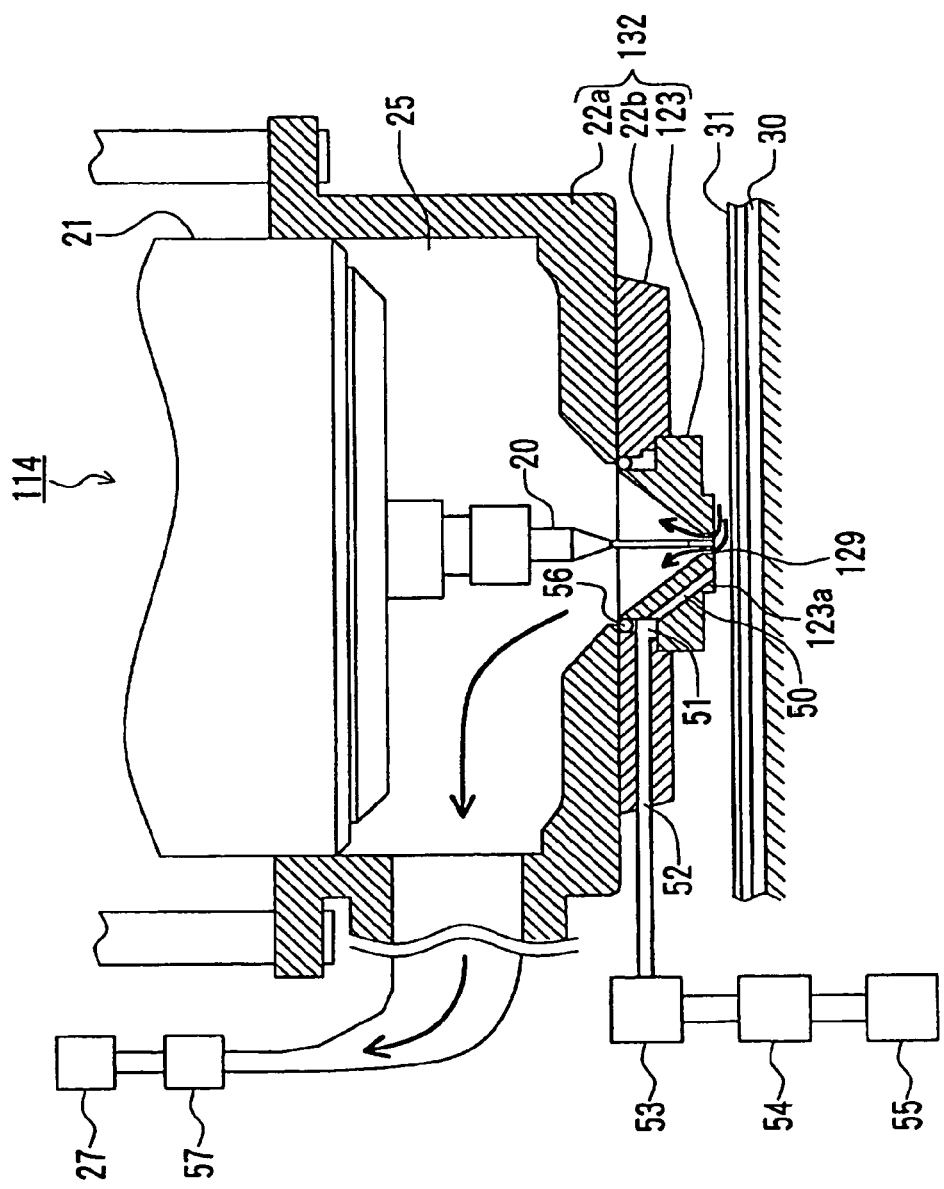
FIG. 1 is a front section view of an edge part of a spindle and a pressure foot of a printed board hole driller, i.e., an exemplary printed board machining apparatus, according to an embodiment of the invention.

FIG. 1 is a front section view of an edge part of a spindle and a pressure foot of the inventive printed board hole driller.

It is noted that in the following description, the same reference numerals as those in the prior art described above denote the same or corresponding parts, and an explanation thereof concerning the structure and operation thereof will be omitted below.

A pressure foot 132 is composed of a body portion 22a, an adapter 22b formed hermetically in a body with the body portion 22a, and a bush 123. The housing 10 supports the body portion 22a through a cylinder (not shown) so that it fits coaxially with a spindle 21 and moves up and down in the Z-axis direction. Thus, the pressure foot 132 fits with the spindle 21 so as to be movable along the axial direction of the spindle 21. The body portion 22a is provided with the adapter 22b at the end thereof. The adapter 22b is provided with the bush 123. The bush 123 is provided with a drill through opening 129, i.e., a tool through opening, through which the drill 20 moves up and down.

Figure 2:
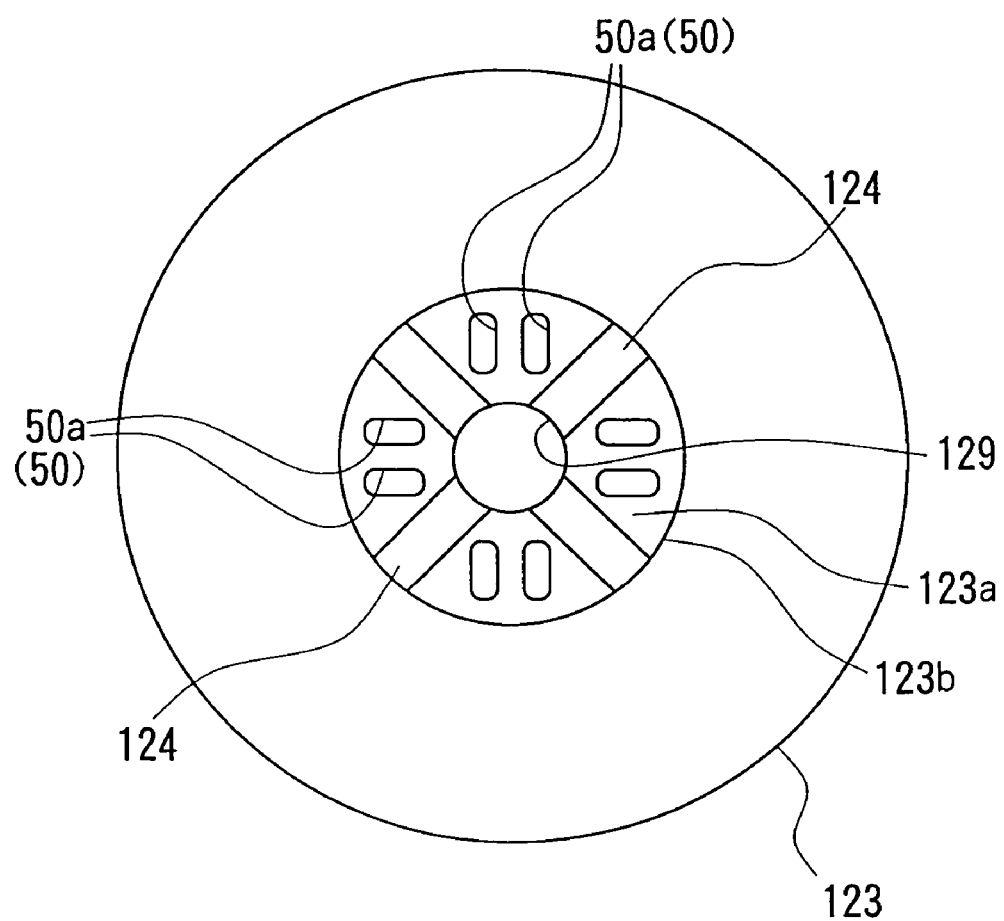
FIG. 2 is a plan view of the edge of a bush.

The bush 123 is also provided with a port 50 from which compressed gas is blown out. The port 50 is oriented so that an axial line thereof extends toward the axial line of the drill 20 (i.e., the opening of the port 50 faces a longitudinal axis of the tool 20). One end of the port 50 is opened to a lower surface (contact face) 123a of the bush 123, and the other end is opened to an air reservoir 51 formed by the bush 123 and the adapter 22b. A plurality of grooves 124 connecting an outer periphery 123b of the bush 123 with the drill through opening 129 are made at the lower (contact) surface 123a of the bush 123 as shown in FIG. 2. The contact surface 123a is the part that contacts with a stiffening plate 31 to press down the stiffening plate 31 and the printed boards 30 to the table 1. It is noted that the outer periphery 123b of the bush 123 is also an outer periphery of the pressure foot 132.

One end of a hole 52 made through the adapter 22b is opened to the air reservoir 51, and the other end is connected to a compressed air source 55 via an electromagnetic valve 53 and a pressure regulator 54. The electromagnetic valve 53, the pressure regulator 54 and the compressed air source 55 compose a compressed gas supply device. It is noted that the pressure regulator 54 is not always necessary for the compressed gas supply device.

An O-ring 56 shuts off a flow of air between the air reservoir 51 and the space 25 and positions and retains the bush 123 in connection with the adapter 22b. A CNC (control) unit 28 controls the electromagnetic valve 53, the pressure regulator 54 and the compressed air source 55.

A pressure sensor 57 is provided between the space 25 and a dust collector (i.e., suction device) 27. The pressure sensor 57 is connected to the CNC unit 28.

An operation of the printed board hole driller will be explained next.

Figure 3A:
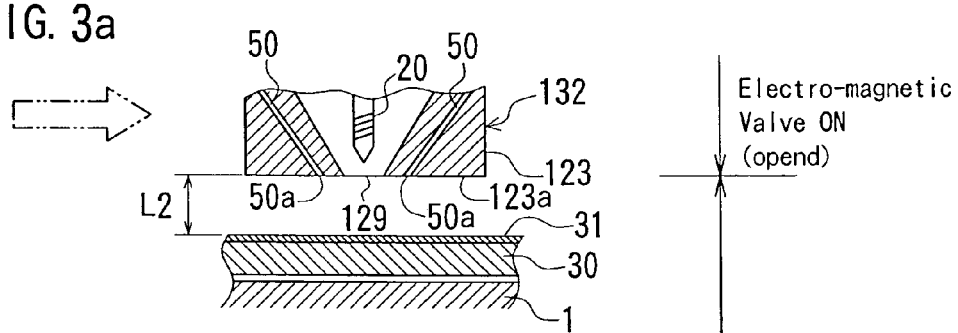
Figure 3B:
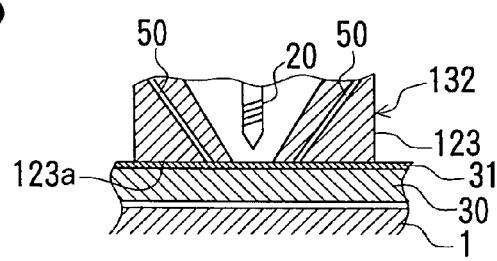
Figure 3C:
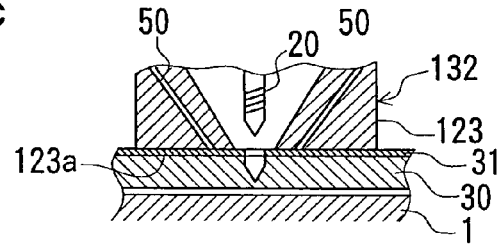
Figure 3D:
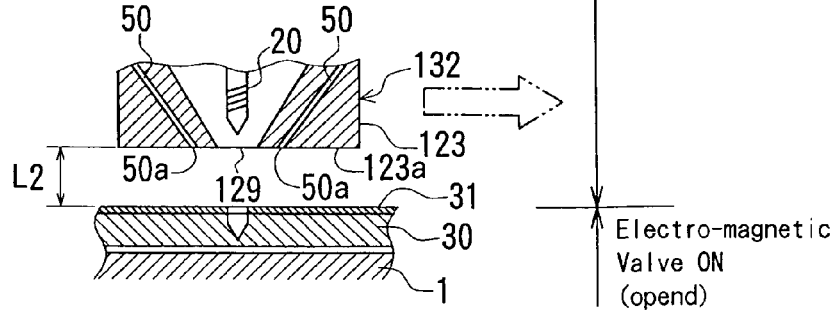
Figure 4:
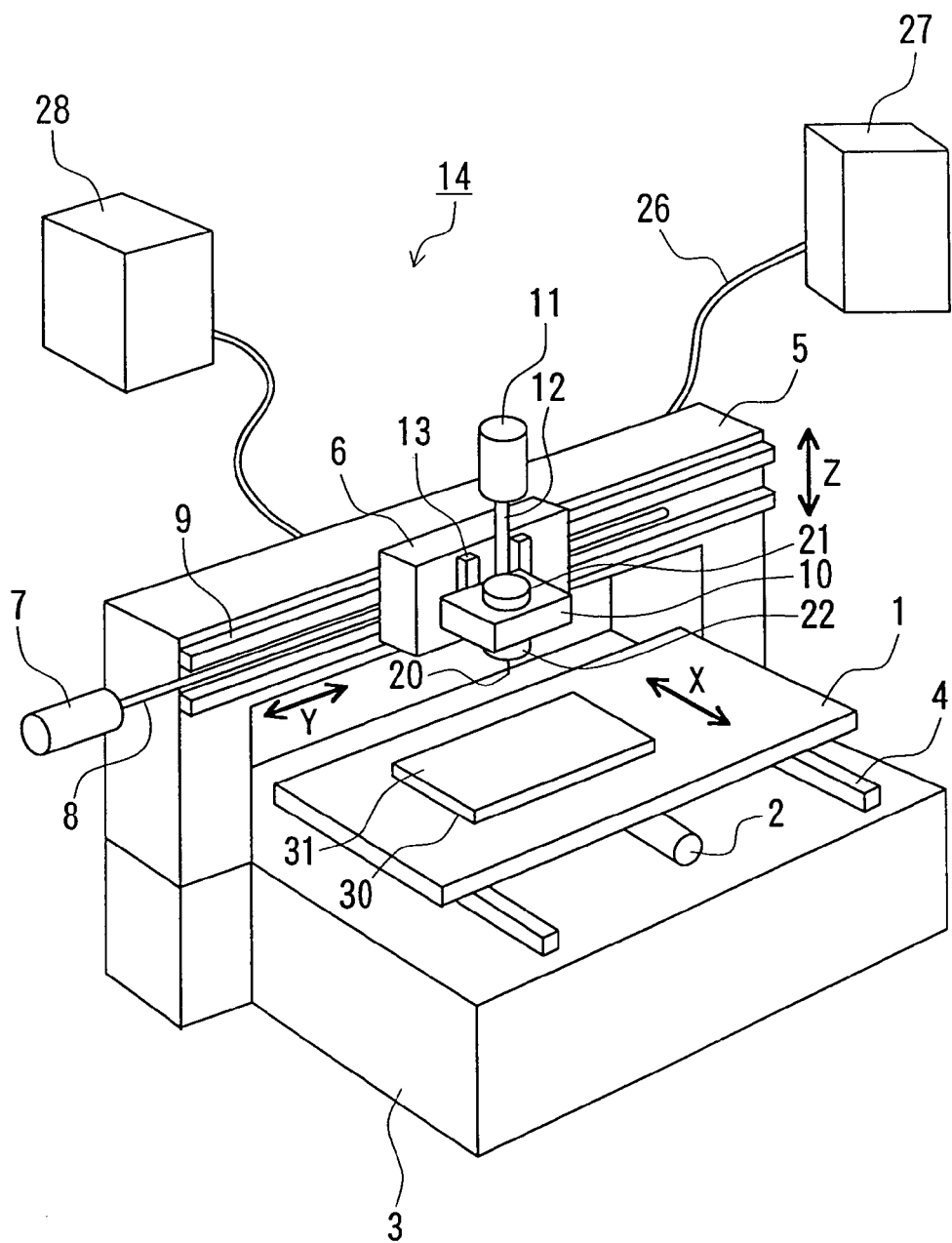
FIG. 4 is a schematic perspective view of an appearance of a printed board hole driller, i.e., an exemplary prior art printed board machining apparatus.

FIGS. 3a, 3b, 3c and 3d are schematic section views for explaining an operation of the printed board machining apparatus of the embodiment, wherein FIG. 3a shows a state in which a drill 20 that has moved in the horizontal direction is positioned at a standby machining position and is about to move down together with a spindle, FIG. 3b shows a state in which a pressure foot 132 is in contact with a stiffening plate 31, FIG. 3c shows a state in which the pressure foot 132 is about to be separated from the stiffening plate 31, and FIG. 3d shows a state in which the drill 20 rises to the standby position to start to move in the horizontal direction.

According to the present embodiment, the electromagnetic valve 53 is opened when the drill 20 is positioned at the standby position and compressed air is blown out of the edge of the port 50 by the compressed air source 55. Then, when a distance between the pressure foot 132 and the stiffening plate 31 is shortened to a predetermined distance L2 as shown in FIG. 3a, the electromagnetic valve 53 is closed, thus stopping the compressed air from blowing out. The electromagnetic valve 53 is closed until the state shown in FIG. 3d. The electromagnetic valve 53 is opened again when the state shown in FIG. 3d occurs. That is, the electromagnetic valve 53 is closed while the drill 20 is positioned at the machining position, and is opened simultaneously when the drill 20, the printed board 30 and the stiffening plate 31 move relatively in the X and Y directions. The printed boards 30 and the stiffening plate 31 are one example of the workpieces.

When the electromagnetic valve 53 is opened, high-pressure compressed air is blown out of the port 50, thus pressing down the stiffening plate 31 to the printed board 30. Then, the air that has pressed down the stiffening plate 31 to the printed board 30 is suctioned to the space 25 by the suction force of the dust collector (suction device) 27, so that the suction force (caused by the vacuum in space 25) at the edge of the bush 123 decreases. As a result, the stiffening plate 31 is rarely lifted up even when the pressure foot 132 is brought closer to the stiffening plate 31.

Figure 5:
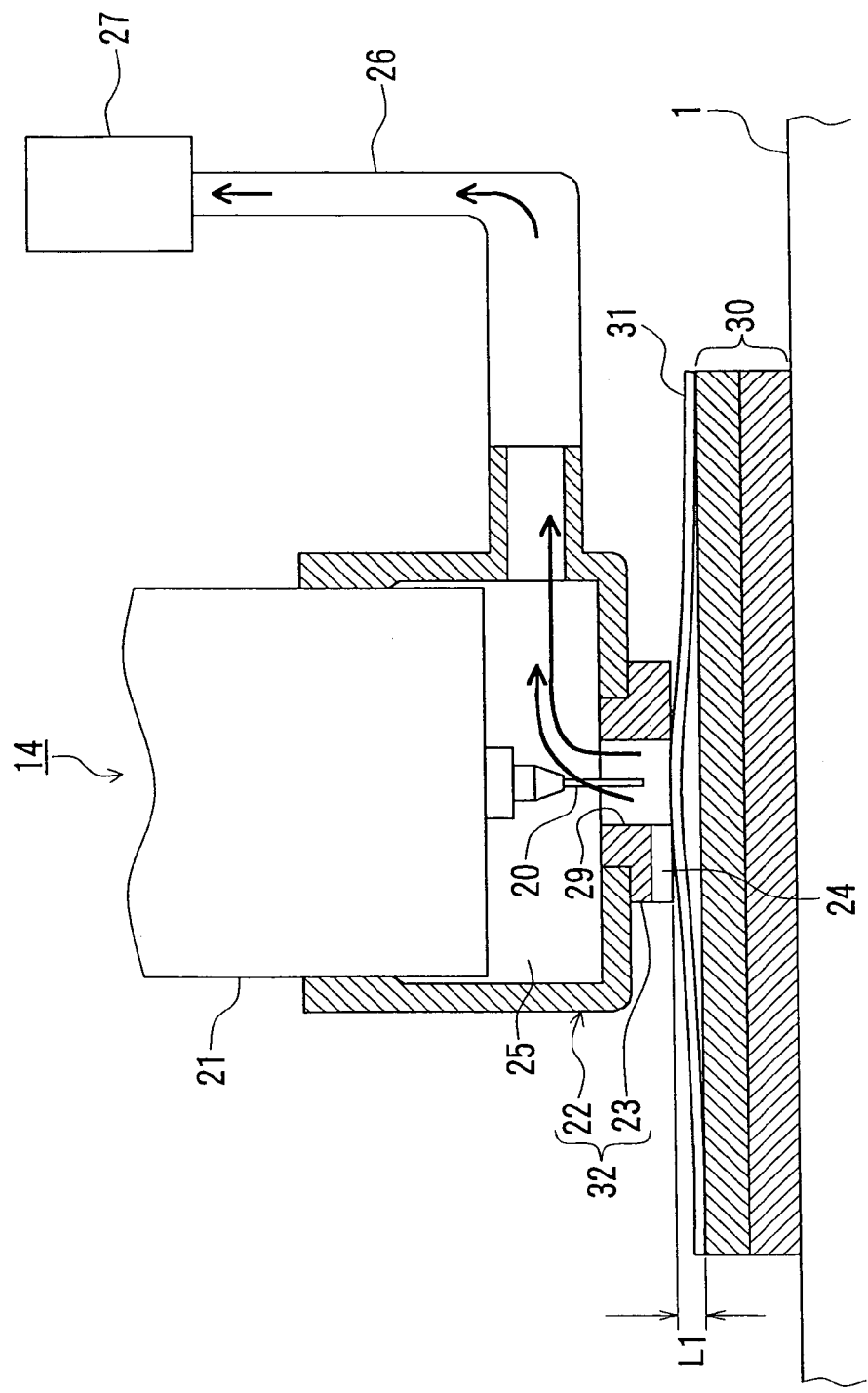
FIG. 5 is a front section view of an edge part of a spindle and a pressure foot of the printed board hole driller shown in FIG. 4.

That is, it is possible to shorten the distance L2 between the pressure foot 132 and the stiffening plate 31 in the printed board hole driller 114 of the present embodiment as compared to the distance L1 between the pressure foot 32 and the stiffening plate 31 in the prior art printed board hole driller 14 shown in FIG. 5. It is also possible to shorten the distance between the pressure foot and the stiffening plate to the same degree as that described in Japanese Patent Laid-open No. Hei.3-3713.

Further, because the outside air is suctioned to the space 25 via the grooves 124 while the pressure foot 132 is in contact with the stiffening plate 31, work chips are suctioned to the dust collector 27 efficiently.

The CNC unit 28 always monitors the output of the pressure sensor 57. When the suction force becomes large for some reason and the pressure within the space 25 drops, the CNC unit 28 operates the pressure regulator 54 to increase the pressure of compressed air supplied to the port 50 to prevent the pressure foot 132 from contacting the stiffening plate 31. In other words, the compressed gas supplying device is controlled so as to increase or decrease the pressure of the supplied compressed air according to the pressure (vacuum) measured by the pressure sensor 57.

As described above, the present invention enables consumption of the compressed air to be cut because compressed air is supplied to the port 50 only when it is needed to prevent the stiffening plate 31 from being lifted up.

Further, the present invention enables the machining efficiency to improve without hampering the drilling accuracy of the stiffening plate 31 and the printed boards 30 because it enables the distance L2 between the pressure foot 132 and the stiffening plate 31 to shorten as compared to the distance L1 between the pressure foot 32 and the stiffening plate 31 in the prior art.

It is noted that although the electromagnetic valve 53 has been opened while the drill 20 is positioned at the standby position in the embodiment described above, it is possible to arrange the machining apparatus so that the electromagnetic valve 53 opens when there is a gap between the pressure foot 132 and the stiffening plate 31.

Still more, it is also possible to arrange the machining apparatus so that the electromagnetic valve 53 always opens because the force required in pressurizing the stiffening plate 31 by air blown out of the port 50 may be considerably smaller than the force of the pressure foot 132 pressurizing the stiffening plate 31 and the printed board 30.

The contact of the pressure foot 132 with the stiffening plate 31 is minimized because it is possible to prevent the lift of the stiffening plate 31 also when the pressure foot 132 is moving up or down.

It is also possible that an alarm system operates, instead of operating the pressure regulator 54.

It is also possible to use other gas, e.g., nitrogen, instead of the compressed air.

Preferably, the grooves 124 are disposed so that they do not contact the port 50.

The pressure foot main body 22a may be formed in a body with the adapter 22b.

It is also possible to prevent the lift of the stiffening plate 31 by a small amount of compressed air by disposing an opening 50a of the port 50 in the lower face 123a of the bush 123 to be closer to the drill through opening 129 provided at the center of the bush 123.

Because the port 50 is opened in the direction of the drill 20 (i.e., faces the drill), it is possible to prevent the lift of the stiffening plate 31 steadily by pressing down the part to be drilled of the stiffening plate 31 by a small amount of compressed air. Further, because the openings 50a of the ports 50 are made so as to surround the drill 20, it is possible to prevent the lift of the stiffening plate 31 by pressing the part to be drilled of the stiffening plate 31 by a small amount of compressed air.

As described above, because the inventive printed board machining apparatus is arranged so that the air having a pressure which does not interfere with the pressure foot pressurizing the workpieces is blown out of the compressed gas blowout ports, it is possible to prevent interference between the pressure foot and the workpieces. It is also possible to improve the machining efficiency without hampering the machining accuracy because it is possible to shorten the distance between the pressure foot and the workpieces in moving the pressure foot along the upper face of the workpieces.

While the preferred embodiment has been described, variations thereto will occur to those skilled in the art within the scope of the present inventive concepts which are delineated by the following

What is claimed is:
1. A printed board machining apparatus comprising:
   a spindle having a rotatable tool for machining a workpiece placed on a table;
   a pressure foot fitted to said spindle such that said pressure foot is movable along an axial direction of said spindle, said pressure foot having:
      a contact surface for contacting the workpiece;
      a tool through-opening opened through said contact surface for allowing an end of said tool to move therethrough;
      a compressed gas blowout port opened through said contact surface for blowing out compressed gas therethrough to prevent the workpiece from being lifted up; and a groove through said contact surface for allowing an outer periphery of said pressure foot to communicate with said tool through-opening while said contact surface is in contact with the workpiece;

a suction device for vacuuming a space between said spindle and said pressure foot, wherein said tool of said spindle is operable to machine the workpiece while said suction device vacuums the space and while said contact surface of said pressure foot presses the workpiece down to the table; and a compressed gas supplying device for supplying the compressed gas to said compressed gas blowout port of said pressure foot.

2. The printed board machining apparatus of claim 1, wherein said compressed gas supplying device is operable to set a pressure of the compressed gas blown out of said compressed gas blowout port at a pressure that does not interfere with said contact surface of said pressure foot contacting the workpiece so as to permit said contact surface to contact the workpiece while machining the workpiece.

3. The printed board machining apparatus of claim 2, wherein said compressed gas supplying device is operable to supply the compressed gas to be blown out of said compressed gas blowout port while said contact surface is separated from the workpiece and while said contact surface is in contact with the workpiece.

4. The printed board machining apparatus of claim 1, wherein said compressed gas supplying device is operable to stop the supply of the compressed gas while said contact surface is in contact with the workpiece.

5. The printed board machining apparatus of claim 1, wherein said compressed gas supplying device is operable to supply the compressed gas to be blown out of said compressed gas blowout port while at least either one of said tool and the workpiece is moving in a direction across the axial direction of said spindle.

6. The printed board machining apparatus of claim 1, wherein said compressed gas blowout port is oriented through said pressure foot so as to be inclined such that an opening of said compressed gas blowout port in said contact surface faces a longitudinal axis of said tool.

7. The printed board machining apparatus of claim 1, further comprising a pressure sensor for measuring a vacuum within said space, said compressed gas supplying device being operable to increase and decrease a pressure of the compressed gas according to an increase and a decrease of the vacuum measured by said pressure sensor.

8. The printed board machining apparatus of claim 4, further comprising a control unit connected to said pressure sensor and said compressed gas supplying device, said control unit being operable to control said compressed gas supplying device according to the vacuum measured by said pressure sensor.

9. The printed board machining apparatus of claim 1, further comprising a control unit for controlling said compressed gas supplying device according to a vacuum within said space.

10. The printed board machining apparatus of claim 1, wherein said compressed gas supplying device includes a compressed air source, a pressure regulator, and an electromagnetic valve.

11. The printed board machining apparatus of claim 1, wherein said groove of said pressure foot comprises one of a plurality of grooves through said contact surface for allowing an outer periphery of said pressure foot to communicate with said tool through-opening, said grooves being evenly spaced around said tool through-opening so as to extend radially outward from said tool through-opening to said periphery of said pressure foot.

12. The printed board machining apparatus of claim 11, wherein said compressed gas blowout port comprises one of a plurality of compressed gas blowout ports opened through said contact surface for blowing out compressed gas therethrough, said compressed gas blowout ports being evenly spaced around said tool through-opening and between said grooves.

13. The printed board machining apparatus of claim 1, wherein said compressed gas blowout port comprises one of a plurality of compressed gas blowout ports opened through said contact surface for blowing out compressed gas therethrough, said compressed gas blowout ports being evenly spaced around said tool through-opening.

* * * * *